United States Patent
Pellizzer

(10) Patent No.: US 10,629,651 B2
(45) Date of Patent: Apr. 21, 2020

(54) THREE-DIMENSIONAL MEMORY APPARATUS AND METHOD OF MANUFACTURING THE SAME

(71) Applicant: Micron Technology, Inc., Boise, ID (US)

(72) Inventor: Fabio Pellizzer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/855,958

(22) Filed: Dec. 27, 2017

(65) Prior Publication Data

US 2018/0138241 A1 May 17, 2018

Related U.S. Application Data

(63) Continuation of application No. 14/932,707, filed on Nov. 4, 2015, now Pat. No. 9,978,810.

(51) Int. Cl.
  *H01L 27/24* (2006.01)
  *H01L 45/00* (2006.01)
  *G11C 13/00* (2006.01)

(52) U.S. Cl.
  CPC ........ *H01L 27/2481* (2013.01); *G11C 13/003* (2013.01); *G11C 13/004* (2013.01);
  (Continued)

(58) Field of Classification Search
  CPC ............. H01L 27/2463; H01L 27/2472; H01L 27/2481; H01L 27/249; H01L 45/16; G11C 2213/71; G11C 2213/77
  See application file for complete search history.

(56) References Cited

U.S. PATENT DOCUMENTS

| 4,063,224 A | 12/1977 | Kirschner |
| 7,106,625 B2 | 9/2006 | Yeh |

(Continued)

FOREIGN PATENT DOCUMENTS

| CN | 104871313 A | 8/2015 |
| JP | 2005514719 A | 5/2005 |

(Continued)

OTHER PUBLICATIONS

First Office Action dated Jul. 24, 2017 for Taiwan Application No. 105135964.

(Continued)

*Primary Examiner* — Allison Bernstein
(74) *Attorney, Agent, or Firm* — Dorsey & Whitney LLP

(57) ABSTRACT

A three dimensional (3D) memory array and method of manufacturing the same are described. The 3D memory array may include an electrode plane and a memory material disposed through and coupled to the electrode plane. A memory cell included in the memory material is aligned in a same plane as the electrode plane, and the memory cell is configured to exhibit a first threshold voltage representative of a first logic state and a second threshold voltage representative of a second logic state. A conductive pillar is disposed through and coupled to the memory cell, wherein the conductive pillar and electrode plane are configured to provide a voltage across the memory cell to write a logic state to the memory cell. Methods to operate and to form the 3D memory array are disclosed.

20 Claims, 10 Drawing Sheets

(52) U.S. Cl.
CPC ...... *G11C 13/0004* (2013.01); *G11C 13/0026* (2013.01); *G11C 13/0028* (2013.01); *G11C 13/0069* (2013.01); *H01L 27/2409* (2013.01); *H01L 27/249* (2013.01); *H01L 45/04* (2013.01); *H01L 45/06* (2013.01); *H01L 45/065* (2013.01); *H01L 45/126* (2013.01); *H01L 45/1226* (2013.01); *H01L 45/1233* (2013.01); *H01L 45/141* (2013.01); *H01L 45/143* (2013.01); *H01L 45/144* (2013.01); *H01L 45/16* (2013.01); *H01L 45/1608* (2013.01); *G11C 2013/0073* (2013.01); *G11C 2213/71* (2013.01); *G11C 2213/77* (2013.01)

(56) References Cited

U.S. PATENT DOCUMENTS

| | | | |
|---|---|---|---|
| 7,200,045 | B2 | 4/2007 | Lue |
| 7,289,359 | B2 | 10/2007 | Kuo et al. |
| 7,295,407 | B2 | 11/2007 | Yuasa et al. |
| 7,324,377 | B2 | 1/2008 | Lee |
| 7,394,680 | B2 | 7/2008 | Toda et al. |
| 7,515,461 | B2 | 4/2009 | Happ et al. |
| 8,077,505 | B2 | 12/2011 | Chen et al. |
| 8,111,541 | B2 | 2/2012 | Lai et al. |
| 8,299,571 | B2 * | 10/2012 | Ozawa .................. H01L 27/249 257/4 |
| 8,450,713 | B2 | 5/2013 | Awaya et al. |
| 8,729,523 | B2 | 5/2014 | Pio |
| 8,829,646 | B2 | 9/2014 | Lung et al. |
| 8,841,649 | B2 | 9/2014 | Pio |
| 9,105,838 | B2 | 8/2015 | Haimoto et al. |
| 9,728,584 | B2 | 8/2017 | Ramaswamy et al. |
| 10,134,470 | B2 | 11/2018 | Tortorelli et al. |
| 10,418,102 | B2 | 9/2019 | Tortorelli et al. |
| 2004/0042259 | A1 | 3/2004 | Campbell et al. |
| 2004/0062071 | A1 | 4/2004 | Rodriguez et al. |
| 2007/0047300 | A1 | 3/2007 | Lee et al. |
| 2008/0025089 | A1 | 1/2008 | Scheuerlein et al. |
| 2008/0112211 | A1 | 5/2008 | Toda |
| 2008/0205147 | A1 | 8/2008 | Santin et al. |
| 2008/0212363 | A1 | 9/2008 | Fuji |
| 2009/0020745 | A1 | 1/2009 | Jeong et al. |
| 2009/0034325 | A1 | 2/2009 | Lowrey et al. |
| 2009/0040813 | A1 | 2/2009 | Kang et al. |
| 2009/0109737 | A1 | 4/2009 | Kostylev |
| 2009/0154222 | A1 | 6/2009 | Chien et al. |
| 2009/0201740 | A1 | 8/2009 | Willer et al. |
| 2009/0279350 | A1 | 11/2009 | Chen et al. |
| 2010/0020606 | A1 | 1/2010 | Yamada |
| 2010/0067291 | A1 | 3/2010 | Fuji |
| 2010/0208508 | A1 | 8/2010 | Baek et al. |
| 2010/0219392 | A1 | 9/2010 | Tabuchi et al. |
| 2010/0226163 | A1 | 9/2010 | Savransky |
| 2010/0284211 | A1 | 11/2010 | Hennessey |
| 2011/0294290 | A1 | 12/2011 | Nakanishi et al. |
| 2011/0316063 | A1 * | 12/2011 | Tang .................. H01L 27/0688 257/314 |
| 2012/0327708 | A1 | 12/2012 | Du et al. |
| 2013/0026438 | A1 | 1/2013 | Wang et al. |
| 2013/0044534 | A1 | 2/2013 | Kawai et al. |
| 2013/0078776 | A1 | 3/2013 | Kim et al. |
| 2013/0094275 | A1 | 4/2013 | Chen |
| 2013/0200326 | A1 | 8/2013 | Ju et al. |
| 2013/0229846 | A1 | 9/2013 | Chien et al. |
| 2013/0322167 | A1 | 12/2013 | Krebs |
| 2014/0043911 | A1 | 2/2014 | Samachisa et al. |
| 2014/0061574 | A1 | 3/2014 | Pio |
| 2014/0061577 | A1 | 3/2014 | Kanno et al. |
| 2014/0063898 | A1 | 3/2014 | Fantini et al. |
| 2014/0077142 | A1 | 3/2014 | Choi |
| 2014/0131653 | A1 | 5/2014 | Lee et al. |
| 2014/0192585 | A1 | 7/2014 | Hashim et al. |
| 2014/0198553 | A1 | 7/2014 | Lung |
| 2014/0217349 | A1 | 8/2014 | Hopkins |
| 2015/0044849 | A1 | 2/2015 | Pio |
| 2015/0074326 | A1 | 3/2015 | Castro |
| 2015/0187416 | A1 | 7/2015 | Bedeschi |
| 2015/0243336 | A1 | 8/2015 | Karpov et al. |
| 2015/0287460 | A1 | 10/2015 | Lee et al. |
| 2015/0311031 | A1 | 10/2015 | Platzgummer et al. |
| 2015/0311256 | A1 | 10/2015 | Rabkin et al. |
| 2016/0126455 | A1 | 5/2016 | Hayashi et al. |
| 2016/0133319 | A1 | 5/2016 | Fantini et al. |
| 2016/0225459 | A1 | 8/2016 | Boysan et al. |
| 2016/0240249 | A1 | 8/2016 | Kellam et al. |
| 2016/0336066 | A1 | 11/2016 | Lin et al. |
| 2017/0125097 | A1 | 5/2017 | Tortorelli et al. |
| 2017/0125484 | A1 | 5/2017 | Pellizzer et al. |
| 2017/0330916 | A1 | 11/2017 | Hong et al. |
| 2018/0040370 | A1 | 2/2018 | Tortorelli et al. |
| 2019/0295636 | A1 | 9/2019 | Tortorelli et al. |
| 2019/0325957 | A1 | 10/2019 | Tortorelli et al. |

FOREIGN PATENT DOCUMENTS

| | | |
|---|---|---|
| JP | 2006514392 A | 4/2006 |
| JP | 2006514393 A | 4/2006 |
| JP | 2007220281 A | 8/2007 |
| JP | 2008217889 A | 9/2008 |
| JP | 2009534835 A | 9/2009 |
| JP | 2010287872 A | 12/2010 |
| KR | 20150046165 A | 4/2015 |
| TW | 201145279 A | 12/2011 |
| TW | 201212318 A | 3/2012 |
| TW | 201515197 A | 4/2015 |
| WO | 2004084229 A1 | 9/2004 |
| WO | 2011121970 A1 | 10/2011 |
| WO | 2014103577 A1 | 7/2014 |
| WO | 20140176075 A1 | 10/2014 |
| WO | 2017078932 A1 | 5/2017 |
| WO | 2017078988 A1 | 5/2017 |
| WO | 2018031217 A1 | 2/2018 |

OTHER PUBLICATIONS

U.S. Appl. No. 15/231,518, entitled: "Apparatuses Including Multi-Level Memory Cells and Methods of Operation of Same", filed Aug. 8, 2016.
U.S. Appl. No. 15/854,656, entitled 'Three-Dimensional Memory Apparatuses and Methods of Use', filed Dec. 26, 2017.
U.S. Appl. No. 15/841,118 entitled "Apparatuses Including Memory Cells and Methods of Operation of Same" filed Dec. 13, 2017, pp. all.
ISR/WO for P254855.WO.01 dated Feb. 2, 2017 for Appln No. PCT/US2016/057649.
U.S. Appl. No. 15/338,154, entitled "Apparatuses Including Memory Cells and Methods of Operation of Same", filed Oct. 28, 2016.
Chen, et al., "An Access-Transistor-Free (0T/1R) Non-Volatile Resistance Random Access Memory (RRAM) Using a Novel Threshold Switching, Self-Rectifying Chalcogenide Device", Electron Devices Meeting, 2003. IEDM '03 Technical Digest. IEEE International; 4 pages.
Office Action dated Mar. 6, 2018 for Taiwanese Application No. 105135964.
Translation of the Decision of the Intellectual Property Office for TW application No. 105135964 dated Oct. 5, 2018; pp. al.
U.S. Appl. No. 16/137,950, titled "Apparatuses and Methods Including Memory and Operation of Same", filed Sep. 21, 2018, pp. all.
EP Search Report for Application No. 16862692.7 dated May 24, 2019.
Notice of Rejection Grounds dated Jul. 9, 2019 for JP Application No. 2018-522575.
U.S. App. No. 16/436,734 titled "Apparatuses Including Multi-Level Memory Cells and Methods of Operation of Same"; filed Jun. 10, 2019.
U.S. Appl. No. 16/455,561 titled "Apparatuses and Methods Including Memory and Operation of Same" filed Jun. 27, 2019.
Kang, J.F. et al., Scaling and Operation Characteristics of HFOX Based Vertical RRAM for 3D Cross-Point Architecture, IEEE Jul. 2014, 4 pages.

(56) References Cited

OTHER PUBLICATIONS

English Translation of First Office Action for Korean Application No. 10-2018-7015196 dated Sep. 2, 2019.

\* cited by examiner

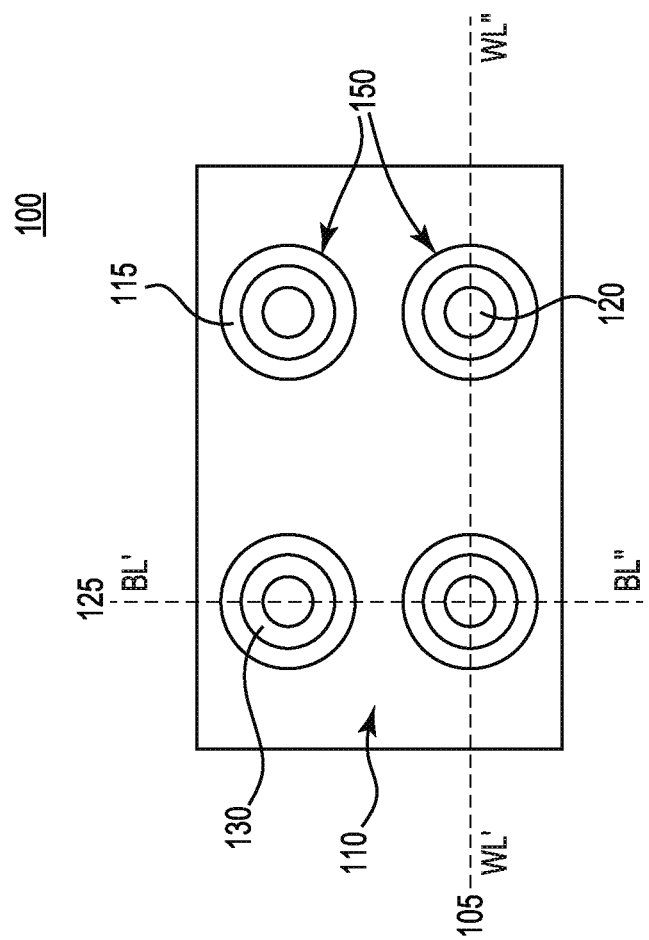

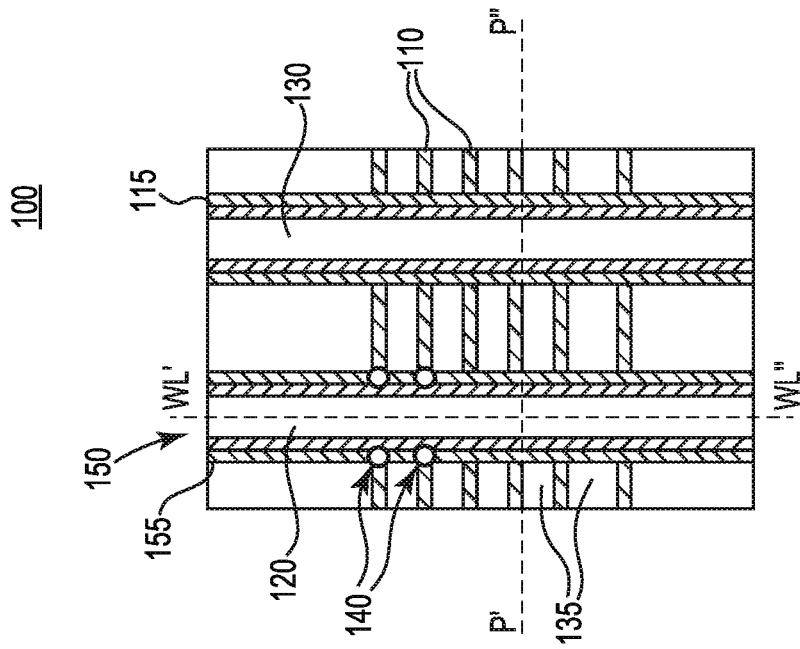
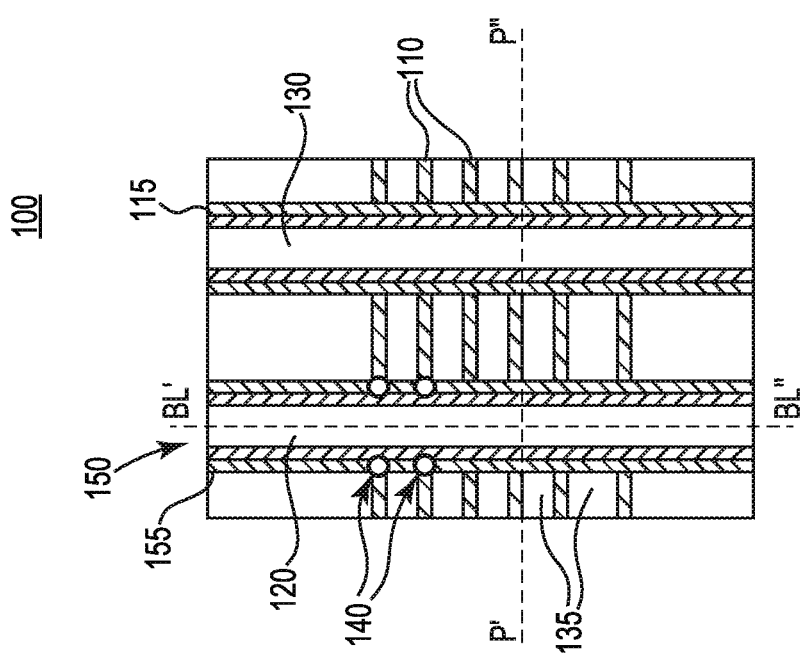
Figure 2B
Figure 2C

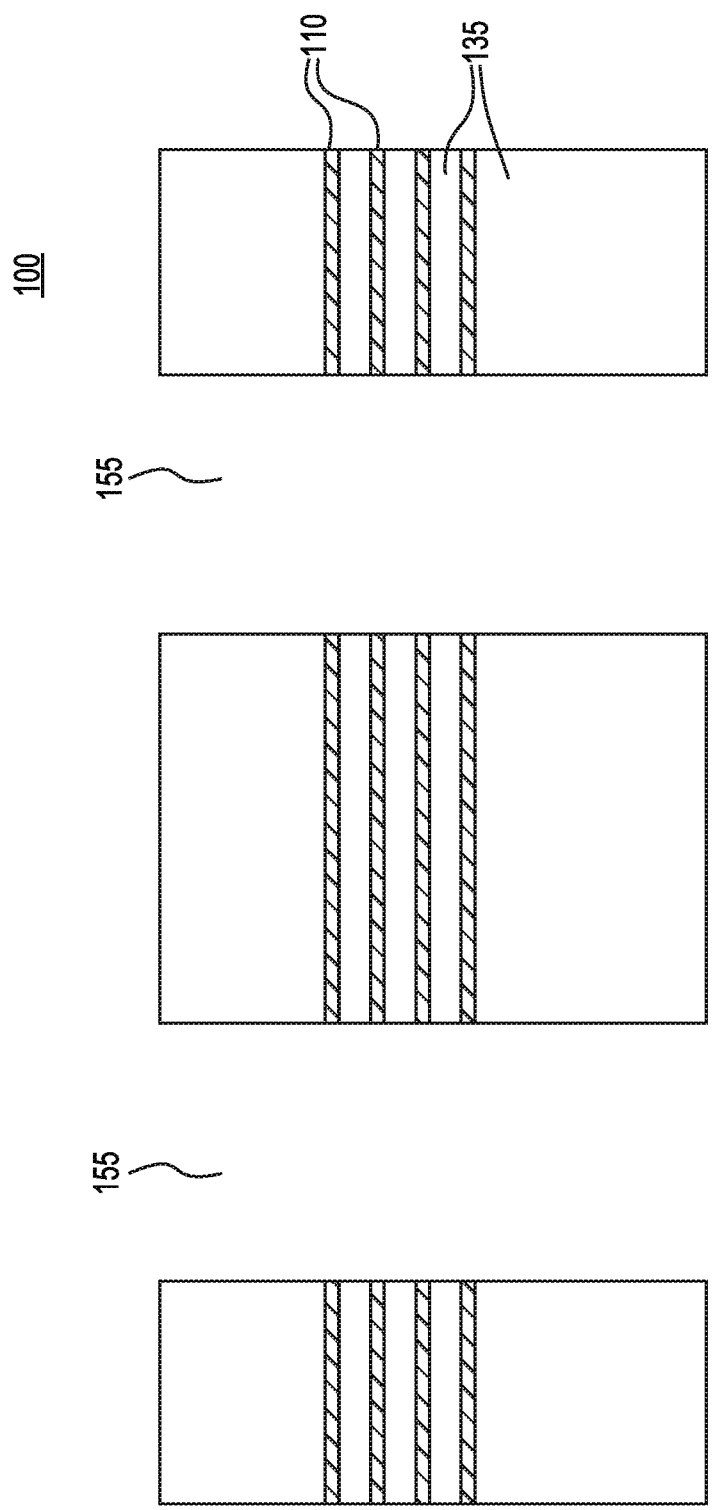

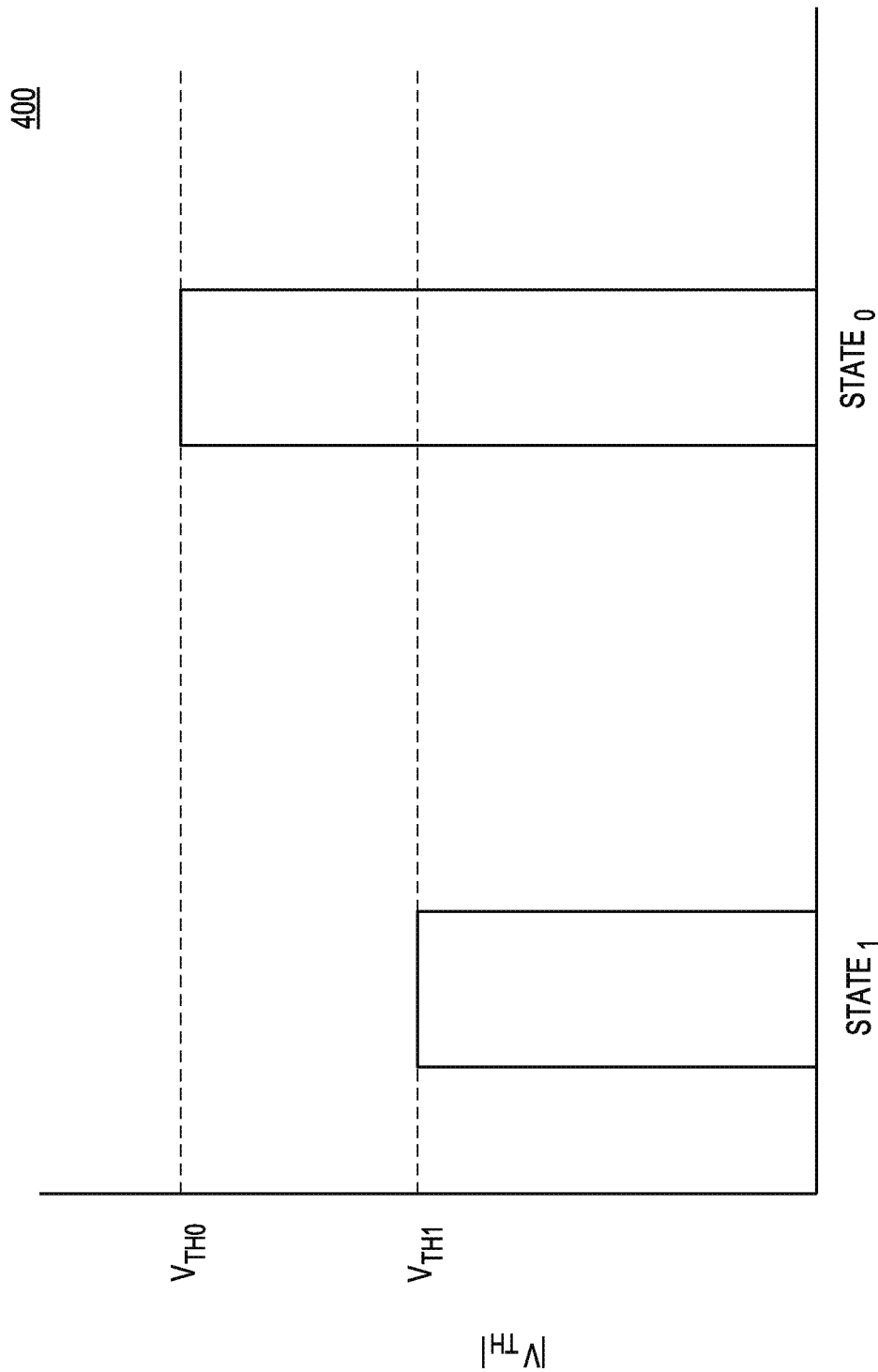

THREE-DIMENSIONAL MEMORY APPARATUS AND METHOD OF MANUFACTURING THE SAME

CROSS-REFERENCE TO RELATED APPLICATION(S)

This application is a continuation of U.S. patent application Ser. No. 14/932,707, filed Nov. 4, 2015 and issued as U.S. Pat. No. 9,978,810 on May 22, 2018. The aforementioned application, and issued patent, is incorporated by reference herein, in its entirety, and for all purposes.

BACKGROUND

Traditional memory devices include a memory element that is used to store a logic state coupled to a selector device. The memory element and selector device may be located at an intersection of a word line and a bit line in a memory array having a three-dimensional architecture. The selector may be coupled to the word line and the memory element may be coupled to the bit line in some architectures. The selector device may reduce leakage currents and be used to select a single memory element for reading and/or writing. However, the use of separate memory elements and selector devices increases the number of materials and/or layers that must be formed during fabrication of the memory device. Activating the selector device and writing to or reading the memory element may require high voltage, high current density, and/or long duration pulses to be provided. These memory requirements may necessitate specific structural solutions that may increase manufacturing complexity and/or cost. The operation requirements may also increase power consumption of the memory device.

BRIEF DESCRIPTION OF THE DRAWINGS

FIG. 2A is a top-down view of a portion of a three dimensional memory array according to an embodiment of the disclosure.

FIG. 2B is a word line view of the portion of the three dimensional memory array shown in FIG. 2A.

FIG. 2C is a bit line view of the portion of the three dimensional memory array shown in FIG. 2A.

FIG. 3B is a schematic illustration of a portion of a partially fabricated memory array according to an embodiment of the disclosure.

FIG. 4 is a voltage plot of threshold voltages according to an embodiment of the disclosure.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

A three-dimensional memory array including a plurality of memory cells may be implemented with memory cells that act as selector devices and memory elements. A memory cell may be a single material between electrodes in some embodiments. This may facilitate a simplified architecture for a three-dimensional memory array and/or other memory architectures. The simplified architecture may require fewer materials, layers, and/or structures, which may reduce processing steps during manufacture. A logic state may be written to the memory cell to store the logic state. The logic state may correspond to one or more bits of data. Voltages of different polarity may be applied to write a logic state to the memory cell. The memory cell may be read by applying voltages of a single polarity. The writing and reading protocols may take advantage of different threshold voltages of the memory cell that result from the different polarities. The memory cell may require short, low power pulses to read and write. In some embodiments, the memory cell may include a chalcogenide. The chalcogenide may not undergo a phase change during reading and/or writing.

Figure 1:
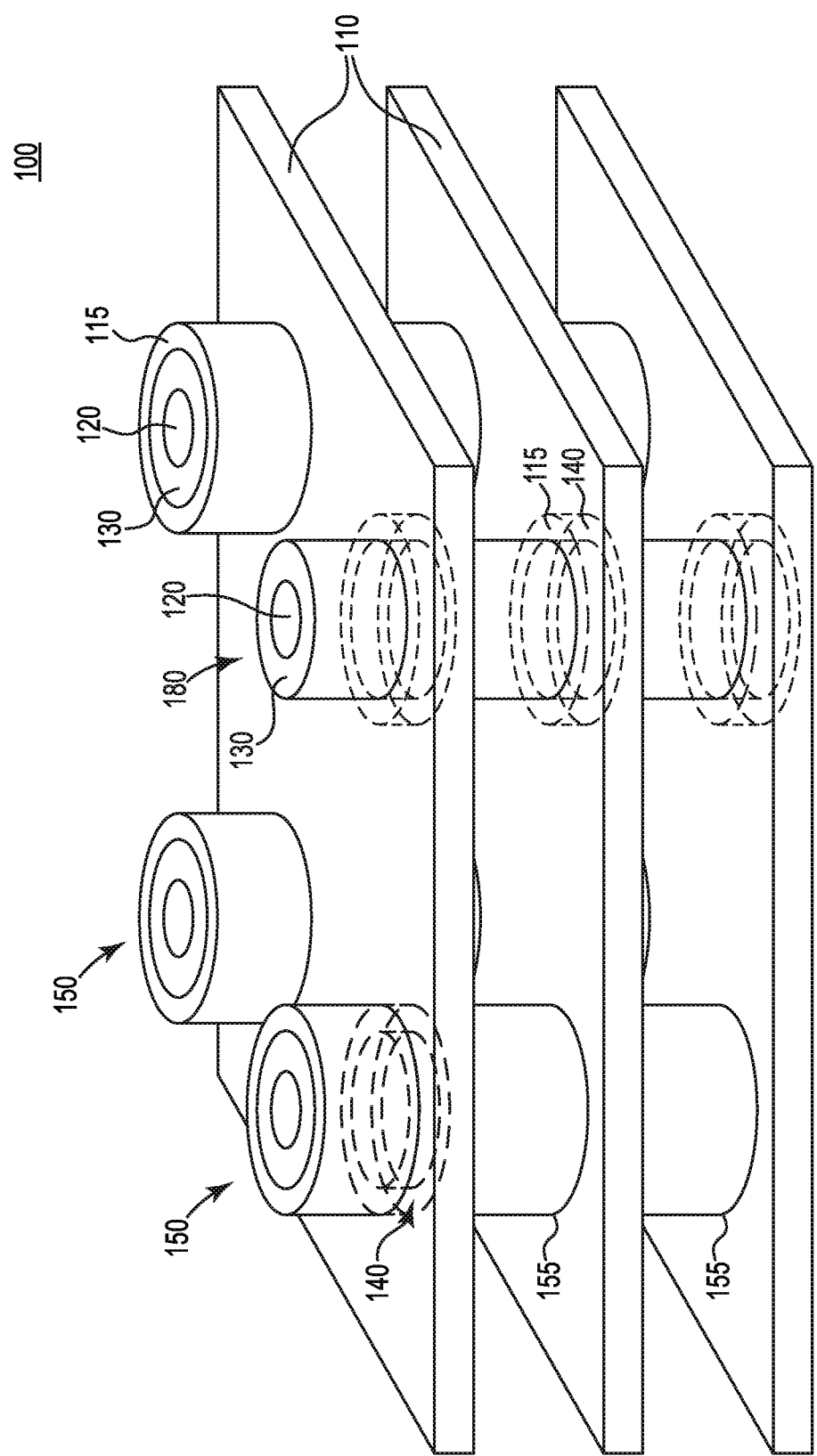
FIG. 1 is an isometric view of the portion of the three dimensional memory array according to an embodiment of the disclosure.

FIG. 1 is an isometric view of a portion of a three-dimensional (3D) memory array 100 according to an embodiment of the disclosure. The memory array 100 may include one or more electrode planes 110. The electrode planes 110 may be separated by layers of dielectric material. The alternating electrode planes 110 and dielectric material form a stack. Memory columns 150 are disposed in openings 155 in the stack. A memory column 150 includes a conductive pillar 120, an electrode cylinder 130, and memory material 115. Memory cells 140 are formed from the memory material 115. The memory cells 140 are ring-shaped and are associated with a respective electrode plane 110. The memory cells 140 of each respective electrode plane 110 may be vertically aligned along a memory column 150. In some embodiments, the memory cells 140 associated with a respective electrode plane 110 are aligned in the same plane as the respective electrode plane 110. By aligned in the same plane, it is meant that at least a portion of the memory cell 140 is disposed at an overlapping position along a length of the memory column 150 of at least a portion of the electrode plane 110. In some embodiments, the entire memory cell 140 may be aligned in the plane of the electrode plane 110. In some embodiments, memory cell 140 may have a thickness that is equal to or less than a thickness of the electrode plane 110. In some embodiments, a portion of the memory cell 140 may extend above and/or below the plane of the electrode plane 110. In some embodiments, the memory cell 140 may have a thickness that is greater than a thickness of the electrode plane 110.

In the embodiment of FIG. 1, the conductive pillar 120, electrode cylinder 130, and memory material 115 of the memory columns 150 are formed as concentric cylinders. In some embodiments, the conductive pillar 120, electrode cylinder 130, and memory material 115 may be formed as other concentric shapes. The memory material 115 may include a chalcogenide. In some embodiments, the chalcogenide material may be a phase change material. In some embodiments, the memory material 115 may include a ternary composition that may include selenium (Se), arsenic (As), and germanium (Ge). In some embodiments, the memory cell 115 may include a quaternary composition that may include tellurium (Te), Se, As, and Ge. Other materials may also be used. In some embodiments, the memory material 115 may be selectively deposited in the same plane as the electrode plane 110 to form memory cell 140. This alternative embodiment is shown in FIG. 1 as memory column 180. As shown with memory column 180, the memory material 115 may not extend the entire length of the column 150.

FIGS. 2A-C are illustrations of the portion of the 3D memory array 100 shown in FIG. 1. FIG. 2A is a top-down view of the portion of the 3D memory array 100. While FIG. 2A illustrates one electrode plane 110, it will be appreciated that the memory array 100 may include additional electrode planes 110. With reference to FIG. 2A, the memory columns 150 extend into the page as viewed by a reader. The memory columns 150 extending through the 3D memory array 100 may be seen in FIGS. 1, 2B, and 2C. Ring shaped memory cells 140 (Shown in FIGS. 2B and 2C) are aligned in the electrode plane 110, resulting from the memory columns 150 (FIG. 1) formed in the openings 155 in the stack of electrode planes 110 and dielectric material. As previously discussed, the memory cells 140 are formed from the memory material 115 and may be ring-shaped in the plane of the electrode plane 110. Although shown as a ring-shape in the embodiment illustrated in FIGS. 1 and 2A-C, the memory material 115 may be formed as other shapes (e.g., rectangle, oval, irregular).

The memory material 115 may be coupled to the one or more electrode planes 110 to form the memory cells 140. The memory material 115 may be further coupled to a conductive pillar 120. The conductive pillar 120 may extend through the stack of electrode planes and dielectric material. That is, it would extend into the page as viewed by a reader. The conductive pillar 120 extending through the stack may be seen in FIGS. 1, 2B, and 2C, where the conductive pillar 120 extends parallel to the plane of the page. Although shown as a cylinder-shape in the embodiment illustrated in FIGS. 1 and 2A-C, the conductive pillar 120 may be formed as other shapes (e.g., rectangle, oval, irregular). In some embodiments, the memory material 115 may be coupled to the conductive pillar 120 via an electrode cylinder 130. The electrode cylinder 130 may comprise a barrier material in some embodiments. The electrode cylinder 130 may extend into the stack of electrode planes 110 and dielectric material similar to the memory material 115 and conductive pillar 120. Although shown as a ring-shape in FIGS. 1 and 2A-C, the electrode cylinder 130 may be shaped to conform to the outer surface of the conductive pillar 120.

As shown in FIG. 2A, the 3D memory array 100 may include multiple conductive pillars 120 surrounded by memory material 115. The conductive pillars 120 and memory material 115 may be arranged in a grid and/or other array pattern. In some embodiments, the conductive pillars 120 may be coupled to memory access lines (e.g., word lines and bit lines). As shown in FIG. 2A, the conductive pillars 120 may be arranged in a word line (WL) 105 direction and a bit line (BL) 125 direction. Although the terms word line and bit line are used herein, it is understood that both word lines and bit lines may generally operate and be referred to as memory access lines. The terms word line and bit line are not meant to be limiting but are used herein to assist the reader in understanding what memory access line is being referred to in the description. As shown in FIG. 2A, the WL 105 extends horizontally, and the BL 125 extends vertically.

Each of the electrode planes 110 may be coupled to one or more memory access lines. In some embodiments, the electrode planes 110 are coupled to word lines and the pillars 120 are coupled to bit lines. Other configurations of coupling memory access lines to the 3D memory array 100 may be used.

FIG. 2B is a word line view of the memory array 100 shown in FIG. 2A. The view in FIG. 2B is the plane indicated by the dotted line labeled WL'-WL" in FIG. 2A. The view shown in FIG. 2A corresponds to the dotted line labeled P'-P" in FIG. 2B. FIG. 2C is a bit line view of the memory array 100 shown in FIGS. 2A and 2B. The view in FIG. 2C is the plane indicated by the dotted line labeled BL'-BL" in FIGS. 2A and 2B. Multiple electrode planes 110 may be seen in the view shown in FIGS. 2B and 2C. The memory array 100 may include any number of electrode planes 110. The electrode planes 110 may be parallel to each other in some embodiments. The electrode planes 110 may be separated by layers of dielectric material 135. The memory material 115 may have a memory cell 140 aligned with the plane of the electrode plane 110. In some embodiments, the memory cell 140 is ring-shaped. In some embodiments, the memory cell 140 may have a vertical thickness corresponding to the thickness of the electrode plane 110. The vertical distance between electrode planes 110 may be sufficient to prevent the memory cells 140 in the memory material 115 aligned with each electrode plane 110 from interfering with each other. This may facilitate the use of a memory column 150 to provide memory cells 140 without the need to form isolation regions between the memory cells 140 along the memory material 115.

In the embodiment illustrated in FIGS. 2A-C, FIG. 2C is identical to FIG. 2B because of the symmetry in the word line and bit line directions. However, in some embodiments, such as when the array is not symmetrical between the word line and bit line directions, the views along the word line and bit line may not be identical.

The memory array 100 shown in FIGS. 1 and 2A-C may be formed by various thin film techniques including, but not limited to, spin coating, blanket coating, chemical vapor deposition (CVD) such as low pressure CVD, plasma enhanced chemical vapor deposition (PECVD), atomic layer deposition (ALD), plasma enhanced ALD, physical vapor deposition (PVD), thermal decomposition, and/or thermal growth, among others. Alternatively, materials may be grown in situ. While the materials described and illustrated herein may be formed as layers, the materials are not limited thereto and may be formed in other three-dimensional configurations.

Figure 3A:
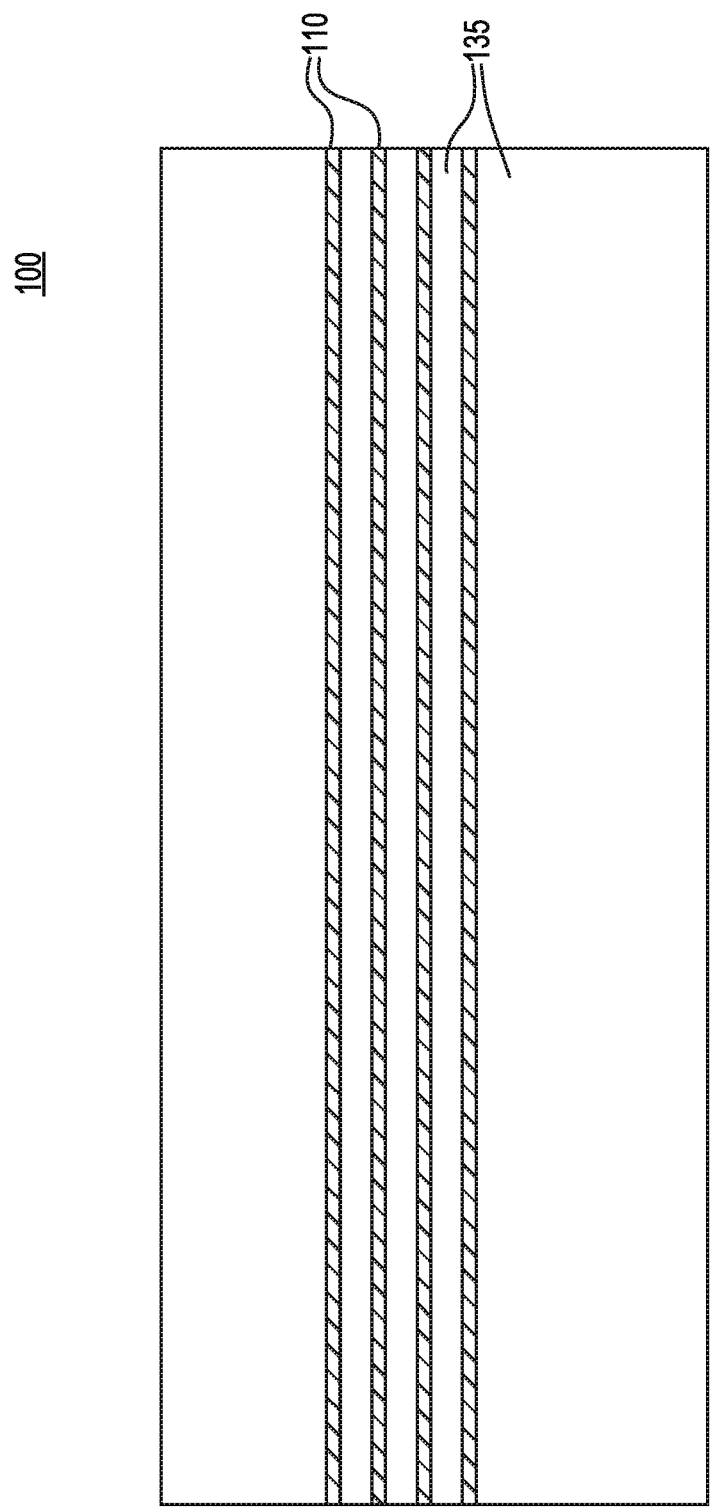
FIG. 3A is a schematic illustration of a portion of partially fabricated memory array according to an embodiment of the disclosure.
Figure 3C:
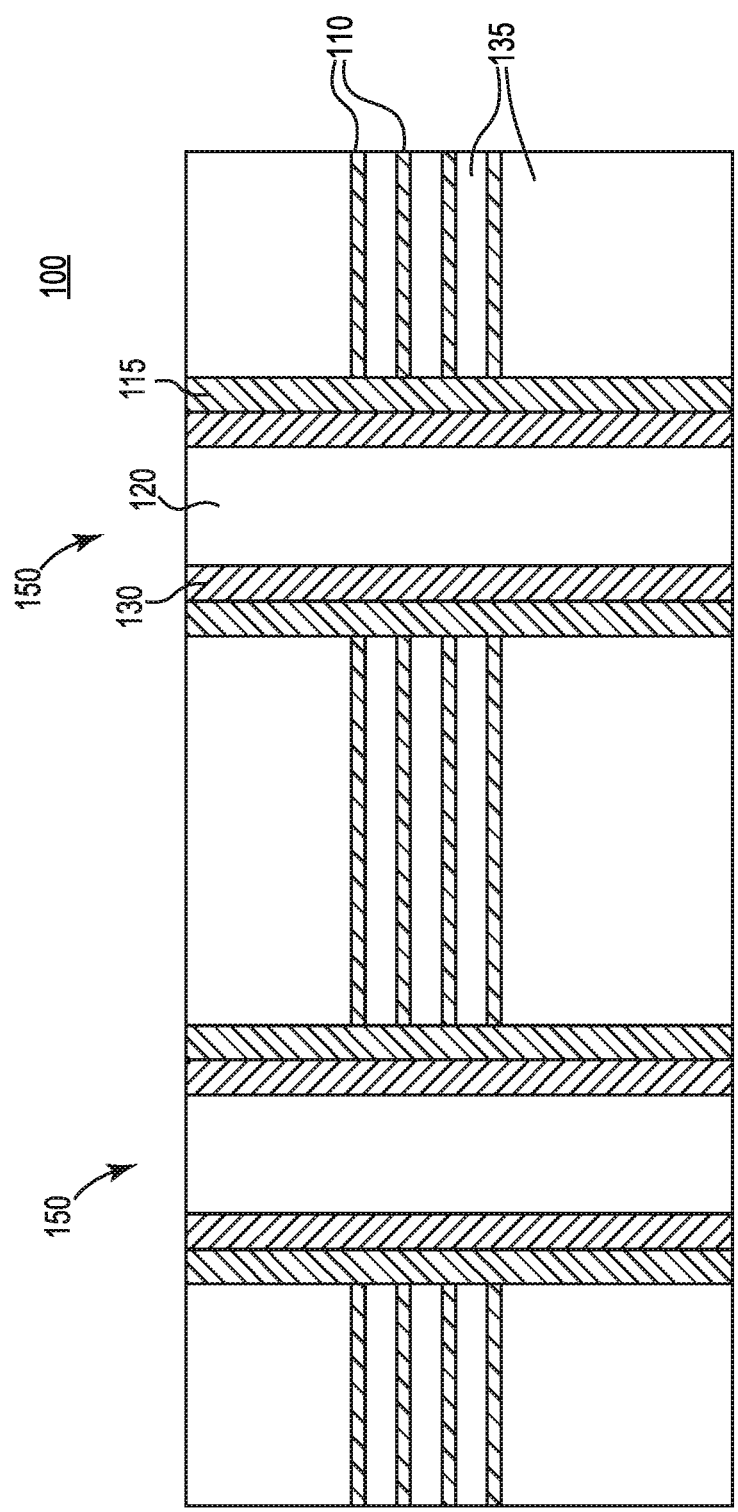
FIG. 3C is a schematic illustration of a portion of a memory array according to an embodiment of the disclosure.

FIGS. 3A-C show a portion of a memory array 100 at different steps of fabrication. As shown in FIG. 3A, the electrode planes 110 and dielectric material 135 may be deposited as alternating layers to form a stack. The electrode planes 110 may be formed of a metallic material, a polysilicon material, and/or other conductive material. The dielectric material 135 may be an oxide or other suitable insulating material. The electrode planes 110 and/or dielectric material 135 may be thin films. As shown in FIG. 3B, openings 155 may be formed in the stack of electrode planes 110 and dielectric material 135. The openings 155 may be formed by etching, milling, and/or other known technique. In some embodiments, a mask may be employed to align the openings 155 on the stack. As shown in FIG. 3C, memory columns 150 are formed in the openings 155 in the stack of electrode planes 110 and dielectric material 135. A conformal layer may be formed in the openings to form the memory material 115. The electrode cylinder 130 may be formed from a second conformal layer, and a conductive pillar 120 is formed to fill the remaining opening. In some embodiments, the electrode cylinder 130 may be omitted. Alternatively, the openings 155 may be filled with the memory material 115 then a second set of openings formed in the memory material 115. The second set of openings may be filled with the electrode cylinder 130 and a third set of openings formed in the electrode cylinder 130. The third set of openings may be filled to form the conductive pillars 120. A combination of forming openings and depositing conformal layers within the openings may also be used. The conductive pillars 120 and electrode planes 110 may then be coupled to memory access lines included in a memory array.

In some embodiments, not shown in FIGS. 3A-C, recesses may be formed in each of the electrode planes 110 after openings 155 are formed. A conformal layer of memory material 115 may be selectively formed in the recesses. In some embodiments, this may selectively provide memory material 115 in the same plane as the electrode planes 110 without providing memory material 115 in the same plane as the dielectric material 135.

The memory cell 140 may be written to store one of at least two different logic states (e.g., '1,' '0') by a write operation. In some embodiments, a memory material 115 may include multiple memory cells 140 and each of the memory cells 140 may be independently written to store one of the at least two logic states. In some embodiments, the different logic states may be defined by different threshold voltages ($V_{TH}$) of the memory cell 140. The threshold voltage exhibited by the memory cell 140 may be based on a polarity of a write pulse applied to the memory cell 140 during a write operation and on a polarity of a read pulse applied to the memory cell 115 during a read operation. The write pulse and read pulse may be applied to the memory cell 140 using the electrode plane 110 and conductive cylinder 120.

The memory cell 140 may be configured as a two-terminal device between the electrode plane 110 and conductive cylinder 120 in some embodiments. A first logic state may be written to the memory cell 140 by applying a voltage (e.g., a write pulse) across the memory cell 140 in a first polarity. A second logic state may be written to the memory cell 140 by applying a voltage (e.g., a write pulse) across the memory cell 140 in a second polarity, which may be opposite to the first polarity. The memory cell 140 is read by applying a voltage (e.g., a read pulse) across the terminals. The memory cell 140 may always be read with the same polarity. For example, in some embodiments, the memory cell 140 is read by applying a voltage across the memory cell 140 in the first polarity. In other embodiments, the memory cell 140 is read by applying a voltage across the memory cell 140 in the second polarity. When the memory cell 140 is read with the same voltage polarity with which it was written, the memory cell 140 may exhibit a first $V_{TH}$. When the memory cell 140 is read with the opposite voltage polarity with which it was written, the memory cell 140 may exhibit a second $V_{TH}$. The different threshold voltages may be used to represent different logic states.

When the memory cell 140 is a two-terminal device, the relative values of the voltages between the terminals determines the magnitude and polarity applied across the memory cell 140. For example, providing a voltage of 3V to the conductive cylinder 120 and 0V to the electrode plane 110 applies the same magnitude and polarity as providing a voltage of 6V to conductive cylinder 120 and 3V to electrode plane 110. As used herein, forward polarity indicates that the conductive cylinder 120 is set at a higher voltage than the electrode plane 110 and reverse polarity indicates that the conductive cylinder 120 is set at a lower voltage than the electrode plane 110. However, the use of "forward" and "reverse" polarities is by way of example, and the embodiments of the invention are not limited to those of the particular polarity direction described herein.

FIG. 4 is a voltage plot 400 of threshold voltages $V_{TH1}$, $V_{TH0}$ for two logic states $State_1$, $State_0$ of a memory cell according to an embodiment of the disclosure. The threshold voltages of the memory cell are the threshold voltages observed when the memory cell is read. The memory cell may be read using a read voltage in the same polarity each time it is read, for example, in forward polarity. $V_{TH1}$ may be observed in the memory cell when the memory cell was written to in the same polarity as the read voltage. For example, the memory cell may have been written to in a forward polarity and is then read in forward polarity. $V_{TH1}$ may correspond to logic $State_1$. Conversely, $V_{TH0}$ may be observed in the memory cell when the memory cell was written to in the opposite polarity as the read voltage. For example, the memory cell may have been written to in a reverse polarity and is then read in a forward polarity. $V_{TH0}$ may correspond to logic $State_0$. As illustrated by FIG. 4, in some embodiments, different threshold voltages may be observed for the memory cell written and read in opposite polarities in comparison to the memory cell written and read in the same polarity.

Figure 5:
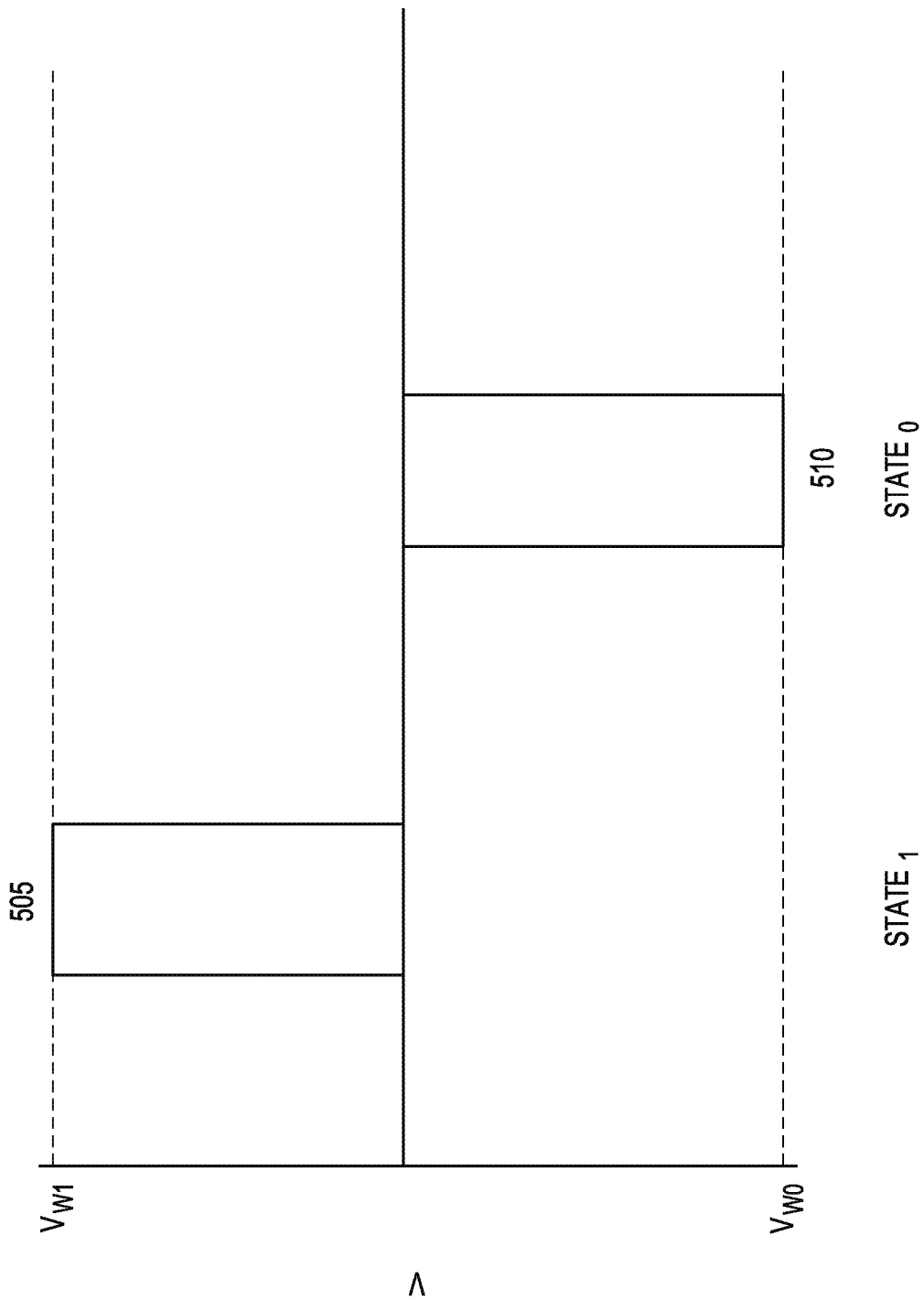
FIG. 5 is a voltage plot of write pulse voltages according to an embodiment of the disclosure.

FIG. 5 is a voltage plot 500 of two write pulses 505, 510 according to an embodiment of the disclosure. The write pulses 505, 510 may be used to write a logic state to a memory cell, such as memory cell 140 shown in FIGS. 1 and 2A-C, during a write operation. The write pulses may be applied by providing a first voltage to the conductive pillar and providing a second voltage to the electrode plane. The resulting voltage applied to the memory cell is the difference between the first and second voltages. The write pulses may be the same duration as read pulses. In some embodiments the duration is 10 ns-50 ns. In some embodiments, the duration is 1-100 ns. Writing to the memory cell may take the same time as reading the memory cell in some embodiments.

The polarity of the write pulses may be either a first polarity or a second polarity (e.g., forward or reverse). Write pulse 505 may apply a voltage $V_{W1}$ to a memory cell in a first polarity (e.g., conductive cylinder at 6V and electrode plane at 0V). The polarity of the write pulse 505 may be the same as the polarity of read pulses. This may write a first logic state ($State_1$) to the memory cell. As shown in FIG. 4, when write pulse 505 writes $State_1$ to the memory cell, the memory cell exhibits threshold voltage $V_{TH1}$ when read.

Write pulse 510 may apply a voltage $V_{W0}$ to the memory cell in a second polarity (e.g., conductive cylinder at −6V and electrode plane at 0V). Write pulse 510 may have the opposite polarity of write pulse 405 and read pulses. Write pulse 510 may write a second logic state ($State_0$) to the memory cell. As shown in FIG. 4, when write pulse 510 writes $State_0$ to the memory cell, the memory cell exhibits threshold voltage $V_{TH0}$ when read.

In some embodiments $V_{W0}$ and $V_{W1}$ may have the same voltage magnitude. In some embodiments, $V_{W0}$ and $V_{W1}$ may have different magnitudes. The magnitudes of $V_{W0}$ and $V_{W1}$ may be selected to be greater than or equal to the greater of threshold voltages $V_{TH0}$ and $V_{TH1}$ of $State_0$ and $State_1$, respectively. For example, $|V_{W0}|=|V_{W1}|=6V$, $V_{TH1}=4.5V$, and $V_{TH0}=5.5V$. In some embodiments, the write pulses may have the same magnitude as read pulses. In some embodiments, the write pulses may have greater magnitudes than the read pulses.

As illustrated in FIGS. 4-5, the observed threshold voltage of a memory cell during a read operation may be set to different threshold voltages based, at least in part, on the polarity of the voltage applied to write to the memory cell and the polarity of the voltage applied subsequently to read the memory cell. The different threshold voltages may be used to correspond to different logic states. In some embodiments, the memory cell may act as a two-terminal threshold switching type device. That is, below the threshold voltage, the device is 'off' and conducts little or no current. Above the threshold voltage, the device is 'on' and conducts a current and/or a current above the threshold current. The different threshold voltages, which result from reading and writing with particular pulse polarities may allow the memory cell to act as both a selector device and a memory element. This may facilitate the use of memory arrays having less complex architectures.

Figure 6:
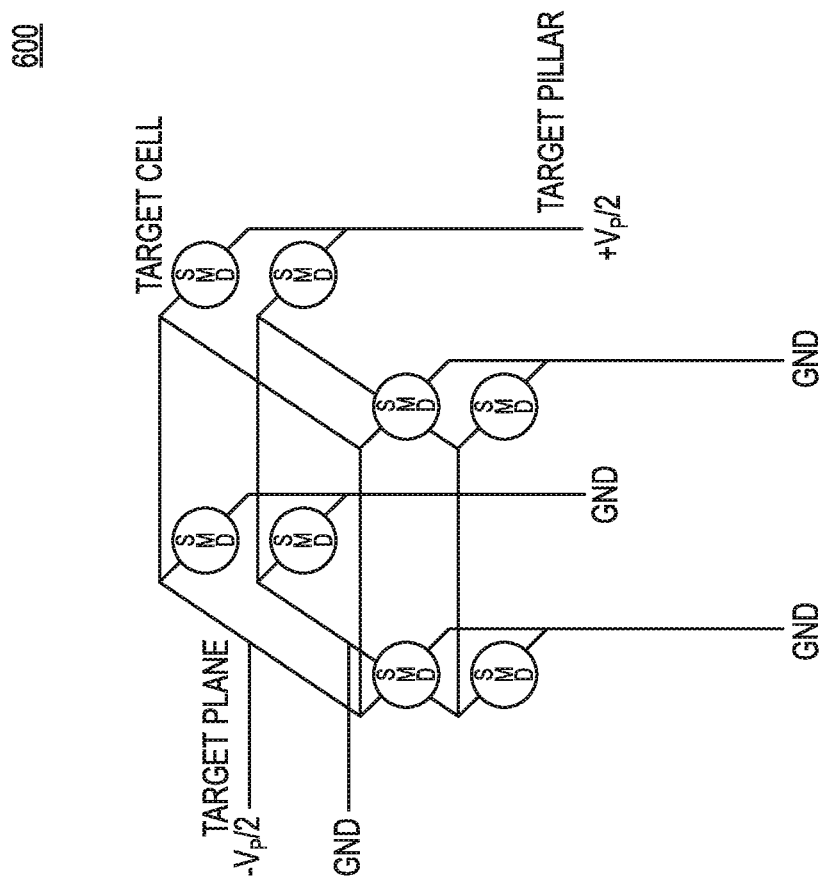
FIG. 6 is a functional diagram of a portion of a three dimensional memory array according to an embodiment of the disclosure.

FIG. 6 is a functional diagram of a portion of a 3D memory array 600 according to an embodiment of the disclosure. The memory cells are labeled SMD in FIG. 6. SMD stands for "selector and memory device" as in some embodiments, the memory cell acts as both the selector device and memory element. To write to a memory cell of a memory array, a single conductive pillar and a single electrode plane may be selectively targeted via memory access lines. This may facilitate addressing and writing to each individual memory cell of the 3D memory array 600. Initially all conductive pillars and electrode planes may be coupled to a common voltage (e.g., ground). To write to a target cell with a positive polarity at $+V_P$ (e.g., $V_{W1}$ shown in FIG. 5), a conductive pillar of the memory cell may be biased to $+V_P/2$ and a desired electrode plane may be biased to $-V_P/2$. The target memory cell may experience a bias voltage of $+V_P$. The remaining non-target memory cells may experience $+/-V_P/2$ or no bias. To write to a target cell with a negative polarity at $-V_P$ (e.g., $V_{W0}$ shown in FIG. 5), a conductive pillar of the memory cell may be biased to $-V_P/2$ and a desired electrode plane may be biased to $+V_P/2$. The target memory cell may experience a bias voltage of $-V_P$. The remaining non-target memory cells may experience $+/-V_P/2$ or no bias (e.g., 0V).

A target cell may be read in a similar manner by biasing the target cell with a voltage $V_R$, but the target cell may always be biased with the same polarity for all read operations. As discussed previously. $V_R$ may be equal to, less than, or greater than $V_P$. In some embodiments, $V_R$ may be higher than $V_{TH1}$ and lower than $V_{TH2}$. In some embodiments, similar voltage partitioning between an addressed conductive pillar and addressed electrode plane may be used as during a write operation. The remaining non-target memory cells may experience $+/-V_R/2$ or no bias (e.g., 0V).

In some embodiments, selecting a single conductive pillar and single electrode plane coupled to memory access lines to select a memory cell may use three levels of decoding circuitry (not shown) to decode address information. The address information may correspond to a specific memory cell. In some embodiments, the address information may be received by the decoding circuitry from a memory controller (not shown). Two levels of circuitry may be used to select the conductive pillar. The conductive pillar may be included in a two-dimensional array of conductive pillars. The decoding circuitry to select the conductive pillar may be similar to decoding circuitry for two-dimensional memory arrays. A third level of decoding circuitry may be used to select the electrode plane. Other decoding circuitry configurations may be used. For example, the electrode planes may be configured to correspond to word lines, and the conductive pillars configured to correspond to bit lines.

Figure 7:
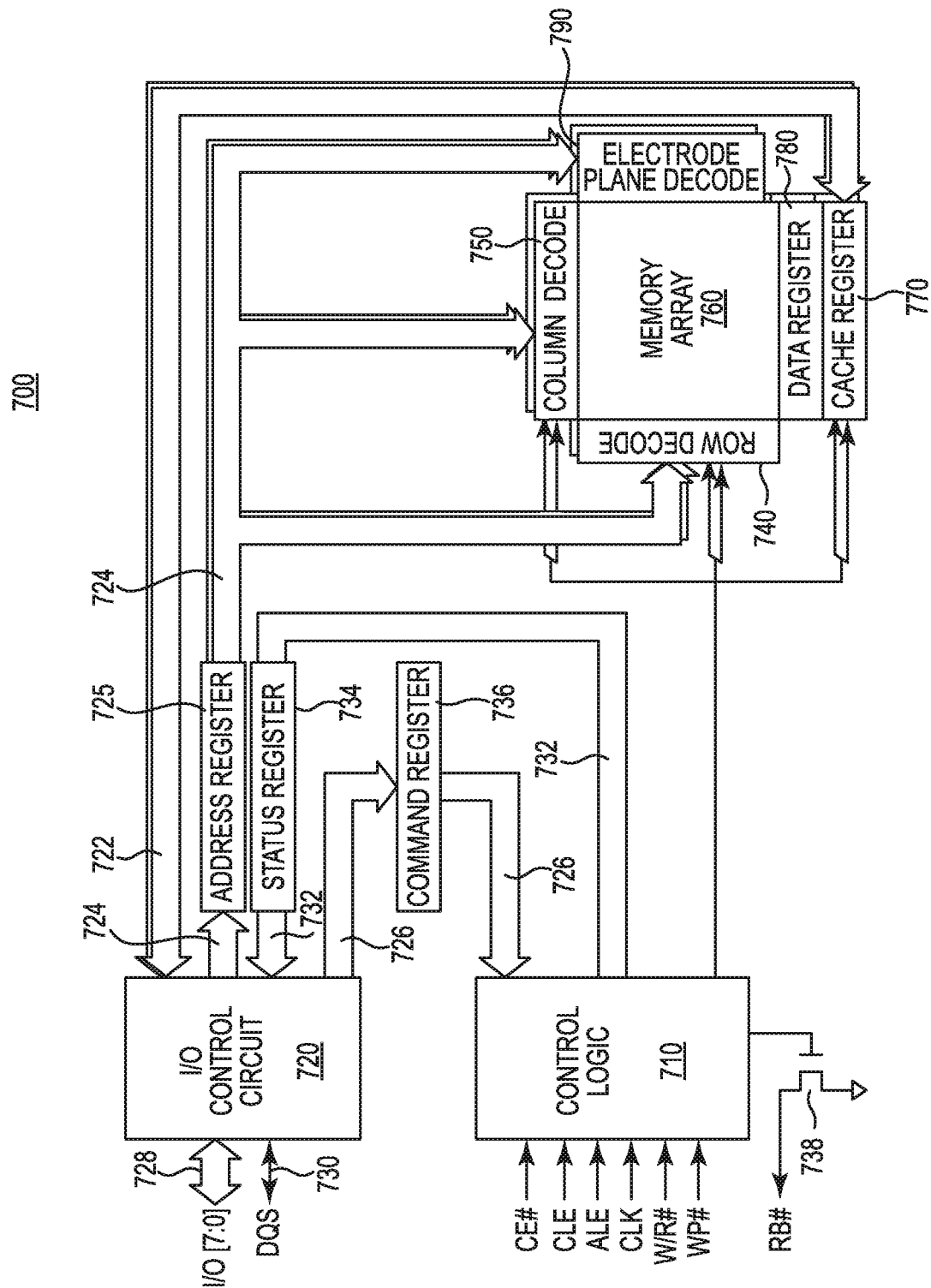
FIG. 7 is a functional block diagram of a memory according to an embodiment of the disclosure.

FIG. 7 illustrates a memory 700 according to an embodiment of the disclosure. The memory 700 includes a memory array 760 with a plurality of memory cells that are configured to store data. The memory cells may be accessed in the array through the use of various signal lines, word lines (WLs) and bit lines (BLs). The memory cells may be non-volatile memory cells, such as phase change memory cells, or may generally be any type of memory cells. The memory cells may be single level cells configured to store data for one bit of data. The memory cells may also be multi-level cells configured to store data for more than one bit of data.

Commands, address information, and write data may be provided to the memory 700 as sets of sequential input/output (I/O) transmitted through an I/O bus 728. Similarly, read data may be provided from the memory 700 through the I/O bus 728. A data strobe signal DQS may be transmitted through a data strobe bus 730. The DQS signal may be used to provide timing information for the transfer of data to the memory or from the memory. The I/O bus 728 is connected to an I/O control circuit 720 that routes data signals, address information signals, and other signals between the I/O bus 728 and an internal data bus 722, an internal address bus 724, and an internal command bus 726. An address register 725 may be provided address information by the I/O control circuit 720 to be temporarily stored. The I/O control circuit 720 is coupled to a status register 734 through a status register bus 732. Status bits stored by the status register 734 may be provided by the I/O control circuit 720 responsive to a read status command provided to the memory 700. The status bits may have respective values to indicate a status condition of various aspects of the memory and its operation.

The memory 700 also includes a control logic 710 that receives a number of control signals either externally (e.g., CE#, CLE, ALE, CLK, W/R#, and WP#) or through the command bus 726 to control the operation of the memory 700. A command register 736 is coupled to the internal command bus 726 to store information received by the I/O control circuit 720 and provide the information to the control logic 710. The control logic 710 may further access a status register 734 through the status register bus 732, for example, to update the status bits as status conditions change. The control logic 710 is further coupled to a ready/busy circuit 738 to control a value (e.g., logic value) of a ready/busy signal R/B# that may be provided by the memory 700 to indicate whether the memory is ready for an operation or is busy. The control logic 710 may be configured to provide internal control signals to various circuits of the memory 700. For example, responsive to receiving a memory access command (e.g., read and write), the control logic 710 may provide internal control signals to control various memory access circuits to perform a memory access operation. The various memory access circuits are used during the memory access operation, and may generally include circuits such as row and column decoders, signal line drivers, data 780 and cache registers 770, I/O circuits, as well as others.

The address register 725 provides block-row address signals to a row decoder 740 and column address signals to a column decoder 750. The row decoder 740 and column decoder 750 may be used to select blocks of memory cells for memory operations, for example, read and write operations. The row decoder 740 and/or the column decoder 750 may include one or more signal line drivers configured to provide a biasing signal to one or more of the access lines in the memory array 760, for example, the BLs and WLs of the memory array 760. In some embodiments, address register 725 may provide a separate electrode plane address to an electrode plane decoder 790. In some embodiments, the electrode plane address may be encoded in the row address and/or column address.

For a write operation, after the row address signals have been applied to the address bus 724, the I/O control circuit 720 routes write data signals to a cache register 770. The write data signals are stored in the cache register 770 in successive sets each having a size corresponding to the width of the I/O bus 728. The cache register 770 sequentially stores the sets of write data signals for an entire row or page of memory cells in the array 760. All of the stored write data signals are then used to write a row or page of memory cells in the array 760 selected by the block-row address coupled through the address bus 724. In a similar manner, during a read operation, data signals from a row or block of memory cells selected by the block-row address coupled through the address bus 724 are stored in a data register 780. The data register 780 and the cache register 770 may act as a single register for some page operations. For example, data stored in the data register 780 may be also stored in the cache register 770. Sets of data signals corresponding in size to the width of the I/O bus 728 are then sequentially transferred through the I/O control circuit 720 from the data register 780 and/or the cache register 770 to the I/O bus 728.

In some embodiments, during a write operation on a memory cell of the memory array 760, a first voltage (e.g., 0V) may be provided to a selected conductive pillar and a second voltage may be provided to a selected electrode plane. The memory cell may be at the intersection of the selected conductive pillar and electrode plane. The second voltage may be higher or lower than the voltage provided to the conductive pillar, based on the logic state to be stored at the address corresponding to the selected conductive pillar and electrode plane (e.g., −6V for '1' and +6V for '0'). In some embodiments, during a write operation, the selected conductive pillar may always be provided a specific voltage, and the electrode plane may be provided a voltage higher or lower than the voltage of the conductive pillar, based on the logic state to be stored at the address.

In some embodiments, during a read operation on a memory cell, a first voltage (e.g., 0V) may be provided to a selected conductive pillar and a second voltage (e.g., −5V, +5V) may be provided to a selected electrode plane. The memory cell may be at the intersection of the selected conductive pillar and electrode plane. The second voltage may be greater than or less than the first voltage provided to the conductive pillar, however, the second voltage may provide the same voltage polarity for every read operation. The logic state of the memory cell may be sensed by a sense amplifier coupled to the selected conductive pillar. The sensed logic state of the memory cell may be provided to the data register 780.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method comprising:
    forming a stack of alternating electrode planes and dielectric layers;
    forming an opening in the stack;
    selectively depositing memory material to form a memory cell from a first conformal layer of memory material in a respective electrode plane of the stack of alternating electrode planes: and
    filling the opening with a conductive pillar; and
    forming, over the memory material, a second conformal layer of barrier material configured to allow current to flow between the respective electrode plane of the stack of alternating electrode planes and the conductive pillar,
    wherein the barrier material is disposed between the memory material and the conductive pillar for the length of the conductive pillar, and
    wherein the conductive pillar is configured to apply, along with the respective electrode plane, a first polarity of a first pulse applied during a write operation of the memory cell and a second polarity of a second pulse applied subsequently during a read operation of the memory cell, to provide the current across the memory cell.

2. The method of claim 1, further comprising:
    forming the second conformal layer of barrier material over the memory material prior to filling the opening with the conductive pillar.

3. The method of claim 1, wherein forming the opening comprises applying a mask and etching the opening in the stack.

4. The method of claim 1, further comprising:
    coupling the electrode planes to a first plurality of corresponding memory access lines; and
    coupling the conductive pillar to a second memory access line.

5. The method of claim 1, wherein the memory cell is aligned with a corresponding electrode plane.

6. The method of claim 5, wherein the memory cell is ring-shaped.

7. The method of claim 6, wherein the ring-shaped memory cell is included in the memory material, and wherein the memory material extends a length of a memory column.

8. The method of claim 7, wherein the electrode planes comprise a plurality of thin films.

9. The method of claim 1, further comprising:
    forming an electrode cylinder between the conductive pillar and the memory material,
    wherein the electrode cylinder is formed from the second conformal layer of barrier material.

10. The method of claim 1, wherein the memory cell is coupled to the respective electrode plane at first and second positions along first and second axes, respectively, in a same plane as the respective electrode plane, and
    wherein the first axis is horizontal, and the first axis is orthogonal to the second axis.

11. A method comprising:
    forming a stack of alternating electrode planes and dielectric layers;
    forming an opening in the stack;
    filling the opening with a conductive pillar:
    forming a conformal layer of barrier material around the conductive pillar, the barrier material configured to allow current to flow between a respective electrode plane of the stack of alternating electrode planes and the conductive pillar; and selectively depositing memory material to form another conformal layer of the memory material including a ring-shaped memory cell in the respective electrode plane of the stack of alternating electrode planes, wherein the conformal layer of barrier material is formed around the conductive pillar in an area in a same plane as each of the electrode planes, and further formed around the conductive pillar in other areas between the areas in the same planes as the electrode planes, respectively, and wherein the memory material is configured to conduct the current between the conductive pillar and a respective electrode plane of the stack of alternating electrode planes, responsive to a first polarity of a first pulse applied by a combination of the conductive pillar and the respective electrode plane during a write operation of the memory cell, and further responsive to a second polarity of a second pulse applied by the combination of the conductive pillar and the respective electrode plane subsequently during a read operation of the memory cell.

12. The method of claim 11, further comprising:
wherein the memory cell formed from the memory material is aligned with a respective electrode plane.

13. The method of claim 12, wherein the memory cell is ring-shaped and included in the memory material and is disposed at an overlapping position along the length of a memory column with the respective electrode plane.

14. The method of claim 13, wherein the electrode planes comprise a plurality of thin films.

15. The method of claim 14, further comprising:
forming an electrode cylinder between the conductive pillar and the memory material,
wherein the electrode cylinder comprises the barrier material.

16. The method of claim 11, wherein a portion of an outer surface of the conformal layer of barrier material formed in the area in the same plane as each of the electrode planes is coplanar with another portion of the outer surface of the conformal layer of barrier material formed in the other areas between the areas in the same planes as the electrode planes, respectively.

17. A method comprising:
forming a plurality of electrode planes that are separated by layers of dielectric material;
forming an opening in the electrode planes and layers of dielectric material;
forming, within the opening, a conductive pillar;
forming, within the opening, a conformal layer of barrier material configured to allow current to flow between a respective electrode plane of the plurality of electrode planes and the conductive pillar; and
selectively depositing memory material to form, between the barrier material and the respective electrode plane of the plurality of electrode planes, another conformal layer of the memory material including a memory cell,
wherein an outer surface of the memory cell is coupled to the respective electrode plane at a first position along a first axis in a first direction of another memory cell among nearest adjacent memory cells, and further coupled to the respective electrode plane at a position along a second axis in a second direction orthogonal to the first direction, and the first and second directions are in the same plane as the respective electrode plane.

18. The method of claim 17, wherein memory cells of the memory material have vertical thicknesses corresponding to thicknesses of the electrode planes, respectively.

19. The method of claim 18, wherein the memory cell is ring-shaped.

20. The method of claim 19, wherein the ring-shaped memory cell is included in the memory material and is vertically aligned with the respective electrode plane along a memory column.

* * * * *